United States Patent [19]

Boone

[11] 4,242,639
[45] Dec. 30, 1980

[54] DIGITAL PHASE LOCK CIRCUIT

[75] Inventor: James G. Boone, Escondido, Calif.

[73] Assignee: NCR Corporation, Dayton, Ohio

[21] Appl. No.: 939,762

[22] Filed: Sep. 5, 1978

[51] Int. Cl.² .......................... H03B 3/04; H03K 5/18
[52] U.S. Cl. ...................................... 328/155; 328/25; 328/55; 364/703
[58] Field of Search .................... 328/155, 55, 25, 161; 364/701, 703

[56] References Cited

U.S. PATENT DOCUMENTS

| | | | |
|---|---|---|---|
| 3,006,547 | 10/1961 | Fellows et al. | 364/703 |
| 3,646,452 | 2/1972 | Horowitz et al. | 328/155 |
| 3,781,695 | 12/1973 | Jackson | 328/155 |
| 4,143,328 | 3/1979 | Kurita et al. | 328/155 |

Primary Examiner—Alfred E. Smith
Assistant Examiner—Thomas P. O'Hare
Attorney, Agent, or Firm—J. T. Cavender; Stephen F. Jewett; Edward Dugas

[57] ABSTRACT

A digital phase lock circuit wherein both the phase and frequency of an output signal are synchronized to an input signal. The present phase lock circuit is comprised of a clock signal source, first, second, and third counters, and a holding register. The first counter is utilized to count a predetermined number of cycles of the input signal to establish a first time period. The second counter receives as another input the clock signal and counts the clocks during the established first time period. The value of counted clocks contained in the second counter at the end of the first time period is divided by the predetermined number of cycles the first counter is set to count, and the result is stored in the holding register. The count in the holding register is used to preset the third counter which is then allowed to count down to zero, at the clock rate. The third counter is preset to the value contained in the holding register at each establishment of the first time period. The cycle time of the third counter is thus synchronized, in phase and frequency, to the incoming signal.

6 Claims, 10 Drawing Figures

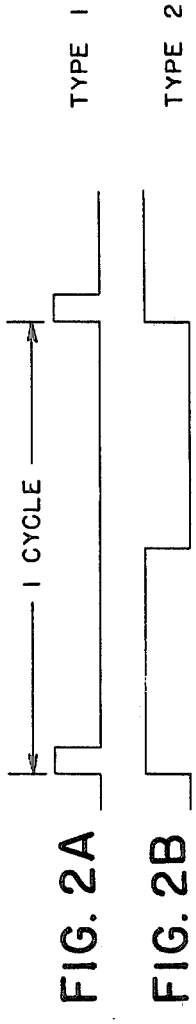
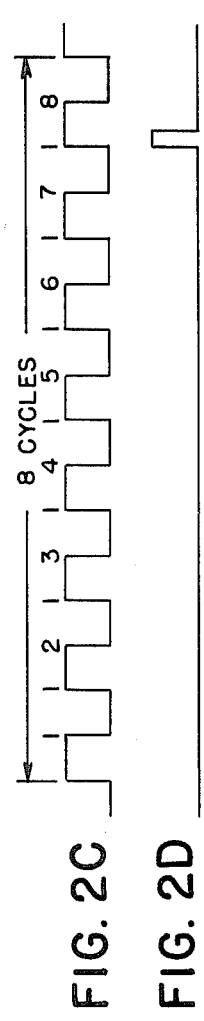
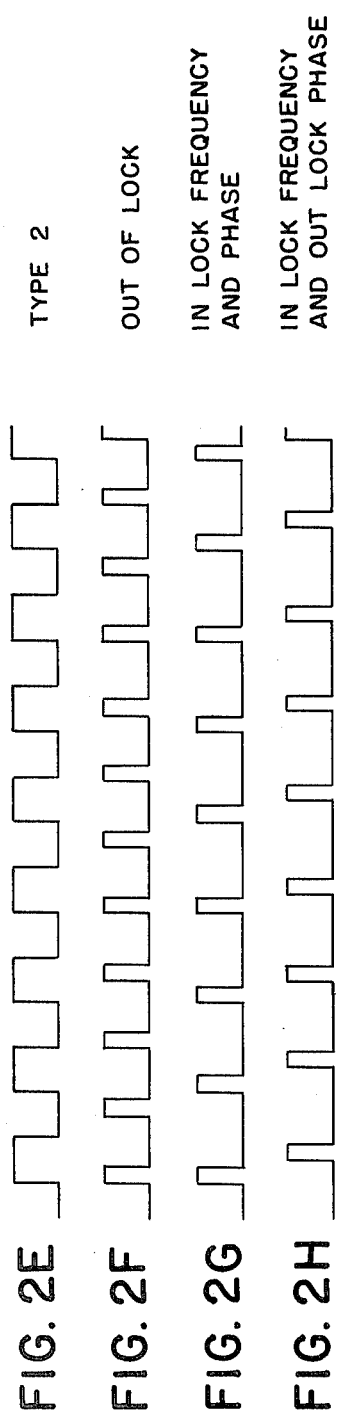
FIG. 2A
FIG. 2B
FIG. 2C
FIG. 2D
FIG. 2E
FIG. 2F
FIG. 2G
FIG. 2H

4,242,639

DIGITAL PHASE LOCK CIRCUIT

BACKGROUND OF THE INVENTION

In certain prior art phase lock loop circuits, a voltage controlled oscillator generates a local reference signal having a frequency which is substantially that of the signal to be received. The local reference signal is varied in phase in response to the voltage level of a control signal that is applied to the voltage controlled oscillator. The control signal is a function of the difference between the phasing of the received signal and the phasing of the local reference signal. The control signal can be derived in a number of ways, one of which is to utilize an up-and-down counter which will produce a resultant positive or negative count that is proportional to the lead or lag of the phase of the received signal with respect to the locally generated reference signal.

One prior art system which is of interest for its teaching of a phase lock circuit wherein both phase and frequency is adjusted is disclosed in U.S. Pat. No. 3,646,452, entitled "Second Order Digital Phase-Lock Loop", by Isaac Horowitz. The system disclosed in the referenced patent is digital in nature.

Another prior art system of interest is disclosed in U.S. Pat. No. 3,781,695, entitled "Digital Phase Locked Loop", by Edward J. Jackson, wherein a reference oscillator of fixed frequency has derived from it the required reference signal by utilizing an up-down counter which is incremented or decremented as a function of the difference between the lead or lag of the phase of the received signal in relation to the phase of the fixed frequency signal. The output signal from the reference oscillator and the output from the up-down counter are directed to a divider circuit wherein the inputs are divided by a consistent K resulting in the addition or subtraction of a pulse into the output signal from the divider, depending upon whether the counter was up or down.

SUMMARY OF THE INVENTION

The present invention is a digital phase lock circuit for synchronizing a locally generated signal, both in phase and frequency, to an input signal. The system of the present invention utilizes a first counter for counting a predetermined number of incoming signal cycles. During the time the first counter is counting, a second counter is counting high frequency clock pulses from a stable clock signal source. When the first counter has reached its preset count, the count in the second counter is divided by the preset number of the first counter and the second counter is reset. The divided count from the second counter is sent to a holding register. The holding register outputs the divided count, in parallel, to a third counter so as to set the third counter to the divided count reflected by the holding register. The third counter counts down to zero from the value of the divided count received from the holding register under the control of the high frequency clock signal. The third counter is reset to the value contained in the holding register upon receipt of a signal from the first counter, indicating that the first counter has reached its predetermined count. The cycle time of the countdown is equivalent to the input signal's cycle time and is phased so as to effectively provide a signal having the same frequency and phase as the input signal.

From the foregoing it can be seen that it is a primary object of the present invention to provide a new and novel digital phase lock circuit.

It is a further object of the present invention to provide a digital phase lock circuit which locks both in frequency and phase.

These and other objects of the present invention will become more apparent when taken in conjunction with the following description and drawings wherein like characters indicate like parts, and which drawings form a part of this application.

BRIEF DESCRIPTION OF THE DRAWINGS

FIGS. 2A through 2H are waveforms taken from strategic locations of the preferred embodiment of FIG. 1.

DESCRIPTION OF THE PREFERRED EMBODIMENT

Figure 1:
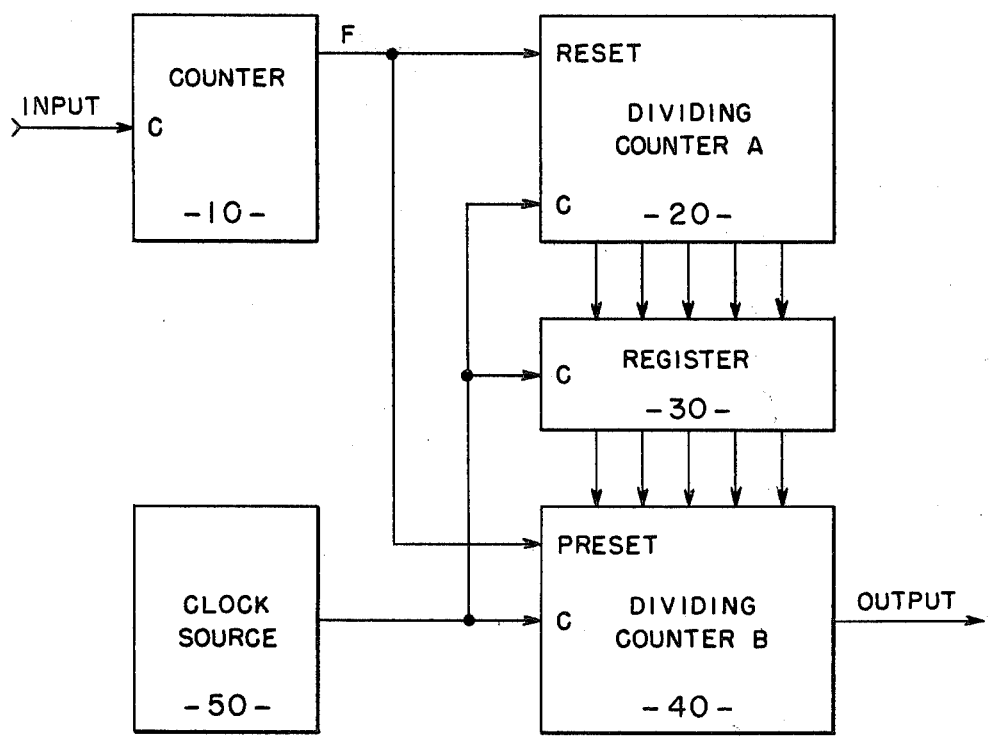
FIG. 1 is an electrical block diagram of the preferred embodiment of the present invention.

Referring to FIG. 1, in conjunction with the waveforms of FIGS. 2A through 2H, a counter 10 provides a signal on its output, F, after counting $X_n$ transitions of an input signal. In the preferred embodiment of the invention $X_n$ is equal to eight input cycles. Two types of input signals, Type 1 and Type 2, having different pulse widths (duty cycles), are set forth in FIGS. 2A and 2B. Counter 10 responds to both Type 1 and Type 2 signals in a like manner. The counter 10 commences counting upon the input signal undergoing a transition from a low to a high state.

FIG. 2C illustrates eight cycles of an input signal of Type 2. FIG. 2D illustrates the output signal appearing at the output, F, after the counter 10 has counted eight cycles of an input signal. The output, F, of counter 10 is directed to the input of a dividing counter 20. Counter 20 is activated during the period that counter 10 is accumulating the input cycle counts. A source of clock pulses 50 is operatively connected to the counting input C of counter 20, such that counter 20 counts the number of clock pulses appearing at its C input during the time that counter 20 is activated (the signal at the F input is at a high level). In the preferred embodiment of the invention the clock source 50 generated 20 Mh pulses at a 50% duty cycle (Type 2). Counter 20 is a dividing counter, which divides the count of clock pulses by the value $X_n$. The output (quotient) from the dividing counter 20 is fed in parallel to the input of a holding register 30. The output from the holding register 30 is directed, in parallel, to the inputs of a dividing down counter 40. Counter 40 effectively divides the clock signal received on its C input by the value presented at the output of the holding register 30. In operation, the counter is preset to the value presented by the holding register 30. The counter 40 then counts down in synchronism with the clock signal. Upon receiving a reset signal from output, F, of counter 10, the counter 40 is immediately preset to the value contained in the holding register and released to again count down. The cycle time (period) of this countdown is equivalent to the input signal's cycle time and the start of the countdown determines the phasing of the output signal. The output signal from counter 40 is thus the system output that is synchronized in frequency and phase with the input signal. If the input signal should cease, the output signal from counter 40 will continue to duplicate the frequency and phase of the last counted input signal. Upon the reoccurrence of the input signal, counting will resume.

In FIGS. 2(E-H), there is depicted an input signal and output signals corresponding to the conditions of: out-of-lock, in-lock in frequency and phase, and an in-lock in frequency, respectively.

As an example of the operation of the system shown in FIG. 1, the input signal to counter 10 (FIG. 2E) will have a 1 Mh nominal value, which signal is to be tracked through variations of ±500 Kh. The counter 10 is set to count eight input cycles. Counter 20 counts the clock signal from clock source 50, which signal is, for purposes of this example, 20 Mh. Counter 10, upon reaching the count of eight, generates a pulse on output, F, to cause the transfer of the count of clock pulses, divided by $X_n$, (8), from the dividing counter 20 to the holding register 30 and to reset itself and counter 20 to zero. If the input signal, when first sampled, was exactly 1 Mh, the dividing counter 20 will have reached a count of $8 \times 20$ or 160 counts and will have divided that count by eight, to provide an output which equals 20. The value 20 will be placed in the holding register 30. Counter 40 will divide the 20 Mh clock by 20 to provide a 1 Mhz output signal. For the next example, assume that the input signal changes to approximately 525 Kh. Eight cycles of this frequency counted by counter 10 results in counter 20 counting 304 counts. The 304 count is divided by eight to yield the value 38, and this count is held in register 30 and transferred to counter 40 when counter 40 is reset. Counter 40, cycling every 38 counts, provides an output signal of approximately 525 Kh. For the next example, assume that the input signal changes to 1.5 Mh. Counter 20 will reach a count of 106. The 106 count is divided by eight to yield approximately 13. Counter 40 cycling every 13 cycles of the 20 Mh clock signal, provides an output signal of approximately 1.5 Mh.

Figure 3:
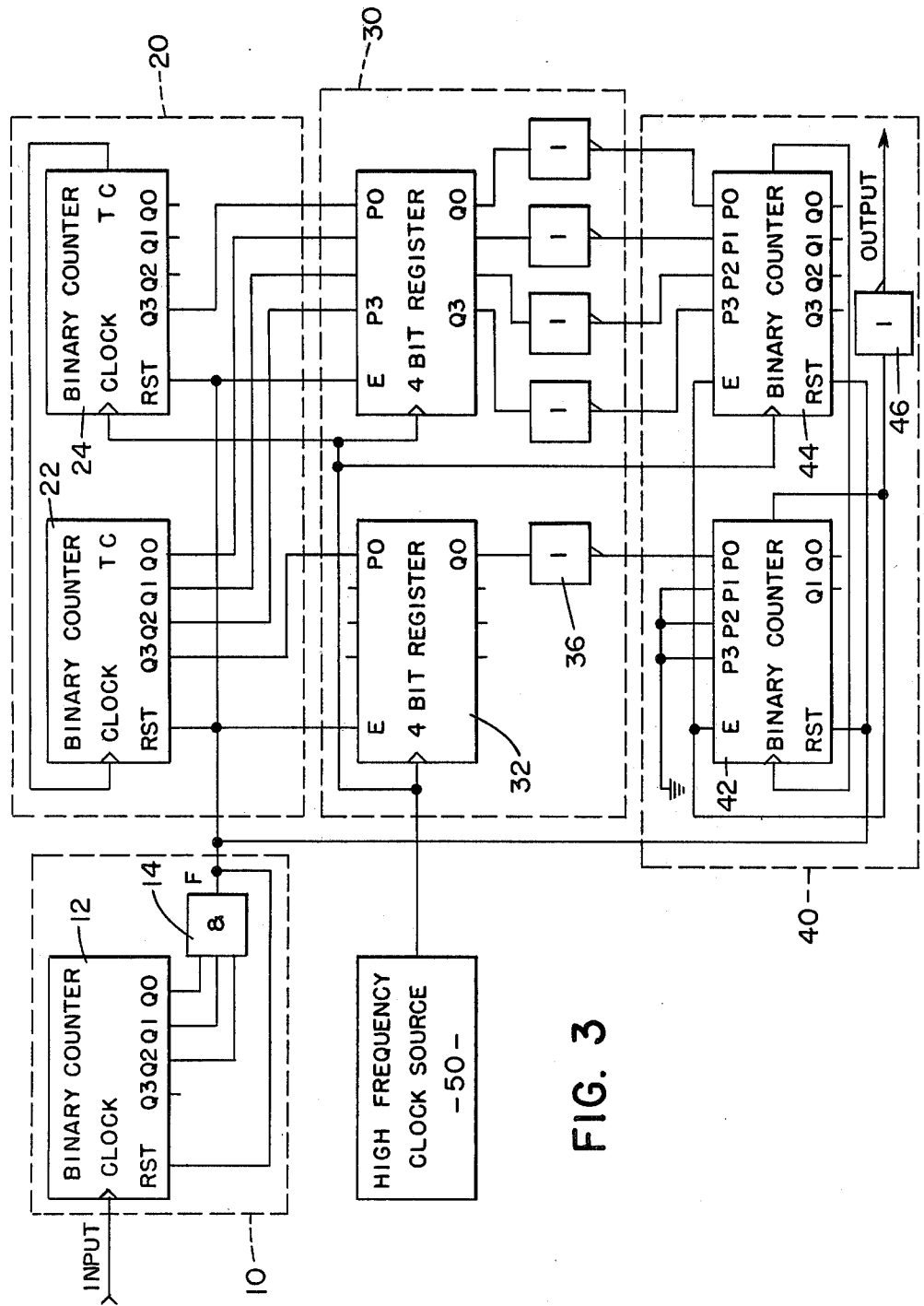
FIG. 3 is a detailed electrical schematic of the block diagram of FIG. 1.

Referring to FIG. 3, the preferred embodiment of the invention, block diagrammed in FIG. 1, is shown in more detail in this Figure. Counter 10 is shown comprised of a binary counter 12 having the outputs $Q_0$, $Q_1$ and $Q_2$ connected as inputs to AND gate 14 with the output of AND gate 14 being fed back to reset the counter. The input to the counter is the input signal source and the output is labeled F. The dividing counter 20 is shown comprised of two cascaded binary counters 22 and 24. The signal on the output, F, of counter 10 is used to reset both binary counters 22 and 24. The clock signal from clock source 50 is directed to the clock input of counter 24. Counter 24 upon each occurrence of a terminal count outputs a pulse to the clock input of the binary counter 22. Division is accomplished by utilizing the bits from outputs $Q_3$ of counter 24 and $Q_0$, $Q_1$, $Q_2$ and $Q_3$ from counter 22. These bits correspond to bits numbered 4, 5, 6, 7 and 8 and represent the clock count divided by eight.

The holding register 30 is shown comprised of four bit registers 32 and 34. The output $Q_0$ from the four bit register 32 is directed to an inverting amplifier 36. In a like manner, the outputs $Q_0$ through $Q_3$ of the four bit register 34 are also directed to inverting amplifiers 36. In the particular mechanization shown, these inverters are required because the counter 40 as shown is an up counter rather than a down counter. That is, counter 40 will count upward to a predetermined terminal count. In the description of counter 40 shown in FIG. 1, the counter was a down counter. Either type of counter may be utilized without degrading the performance of the present system. Counter 40 is shown comprised of binary counters 42 and 44. The signal on output, F, is directed to the reset inputs of binary counters 42 and 44 with the output being taken from the terminal count output of binary counter 42. The terminal count output of binary counter 42 is operatively connected to the enabling terminals E of counters 42 and 44. Additionally, the terminal count is directed to the input of an inverting amplifier 46, the output of which is the system output.

Although the invention has been described and illustrated in detail, it is to be understood that the same is by way of illustration and example only and is not to be taken by way of limitation, the spirit and scope of this invention being limited only by the terms of the appended claims.

What is claimed is:

1. A phase lock circuit comprising:
   means for providing an indication signal upon the occurrence of a predetermined number of transitions in an input signal;
   means for providing a periodic signal;
   first means for dividing the number of periodic signals occurring between successive indication signals by the number of predetermined transitions in the input signal to provide a quotient output signal;
   second means for dividing the predetermined number of periodic signals by said quotient output signal to provide a periodic output signal having a frequency and phase corresponding to said input signal; and
   a holding register means interposed between said first and said second means for holding the quotient output signal from said first means for use by said second means, said holding register means adapted to reset upon receipt of said indication signal.

2. A phase lock circuit comprising:
   a first counter means having an input adapted to receive an input signal and to increment in response to each transition in said input signal, and an output for issuing an output signal each time said first counter reaches a predetermined count;
   a clock means for providing a periodic signal wherein the period is substantially less than the period between transitions of said input signal;
   second counter means operatively connected to said first counter and said clock source for counting the number of periods of said periodic signal which occur between successive output signals from said first counter and for dividing the count by said predetermined count to provide a divided output signal; and
   means for receiving the divided output signal from said second counter and for dividing said periodic signal by said divided output signal, upon receipt of the output signal from said first counter to provide an output signal having a frequency and phase corresponding to said input signal.

3. The phase lock circuit according to claim 2 wherein said means for receiving the output signal is a counter adapted to being set to the count value of said divided output signal, and for incrementing from said count value in response to said periodic signal and reset to the most recent count value in response to said signal from said first counter means.

4. The phase lock circuit according to claim 2 and further comprising:
   a holding register means interposed between said second counter means and said means for receiving for holding said divided output signal from said second counter means for use by said means for receiving, said holding register means adapted to reset upon receipt of the output signal from said first counter means.

5. The phase lock circuit according to claim 2 wherein said second counter means is comprised of cascaded binary counters receiving as a counting input said periodic signal and/or a resetting input the output signal from said first counter means, said divided output signal being derived from selected outputs of said counters.

6. A phase lock circuit for synchronizing a loop generated signal in frequency and phase to an input signal, comprising:
   first means for receiving an input signal and for providing a signal indicative of the occurrence of a predetermined number of transitions of said input signal;
   a clock signal source for providing a train of clock pulses;
   second means for counting the number of clock pulses occurring during the period corresponding to the occurrence of a predetermined number of input signal transitions and for providing an output count corresponding to the count of clock pulses divided by the predetermined number of input signal transitions;
   third means for receiving and holding the output count from said second means; and
   fourth means operatively connected to said first means, said third means, and said clock signal source for generating said loop generated signal by dividing the clock pulses received during the period of each predetermined number of transitions by the count held in said third means.

* * * * *